United States Patent
Vilhelmsson et al.

[11] Patent Number: 5,530,714
[45] Date of Patent: Jun. 25, 1996

[54] EXTERNAL CAVITY LASER

[75] Inventors: Jan-Åke K. Vilhelmsson, Lodjursvägen; Bengt Kleman, Barnhusgatan, both of Sweden

[73] Assignee: Radians Innova AB, Sweden

[21] Appl. No.: 146,014

[22] PCT Filed: May 6, 1992

[86] PCT No.: PCT/SE92/00294

§ 371 Date: Nov. 5, 1993

§ 102(e) Date: Nov. 5, 1993

[87] PCT Pub. No.: WO92/20127

PCT Pub. Date: Nov. 12, 1992

[30] Foreign Application Priority Data

May 8, 1991 [SE] Sweden ................. 9101412

[51] Int. Cl.⁶ ........................................ H01S 3/08
[52] U.S. Cl. ................. 372/92; 372/102; 372/107; 372/108; 372/101
[58] Field of Search .................. 372/92, 93, 98, 372/101, 107, 108, 61, 65; 373/102

[56] References Cited

U.S. PATENT DOCUMENTS

| | | | |
|---|---|---|---|
| 4,873,692 | 10/1989 | Johnson et al. | 372/102 |
| 4,942,583 | 7/1990 | Nazarathy et al. | 372/102 |
| 5,018,831 | 5/1991 | Wyatt et al. | 372/102 |
| 5,058,124 | 10/1991 | Cameron et al. | 372/102 |
| 5,216,680 | 6/1993 | Magnusson et al. | 372/102 |

*Primary Examiner*—Leon Scott, Jr.
*Attorney, Agent, or Firm*—Klarquist Sparkman Campbell Leigh & Whinston

[57] ABSTRACT

Method to arrange and adjust a laser that is stable with respect to external and internal influences, and which comprises at least three optical components consisting of a laser element (1), which can generate optical radiation within a wavelength band $\lambda_1-\lambda_2$, an optical collimator (2) that inside the laser collimates radiation emitted from the laser element, and a plane reflection grating (3) with parallel grating grooves, arranged such that the latter together with a flat reflection surface, which can be one end surface of the laser element, forms a resonator, that selects the radiation wavelength emitted by the laser. At least one optical component, which for instance can be (1), (2) or (3) is fixedly mounted in a holder, that for the purpose of adjusting the laser to a lasing condition can be turned about an axis, that is fixed in the device, such that the angle $\Phi$ between two directions, which are defined by the direction along the grating grooves (G) and by the direction of collimation (LO) of the radiation, varies within an interval that contains $\Phi=90°$ and such that collimated radiation from the laser element, which at $\Phi=90°$ is reflected back from the grating and returns to the radiation emitting portion of the laser element via the collimator (2), has a selected wavelength that lies within the band $\lambda_1-\lambda_2$.

19 Claims, 10 Drawing Sheets

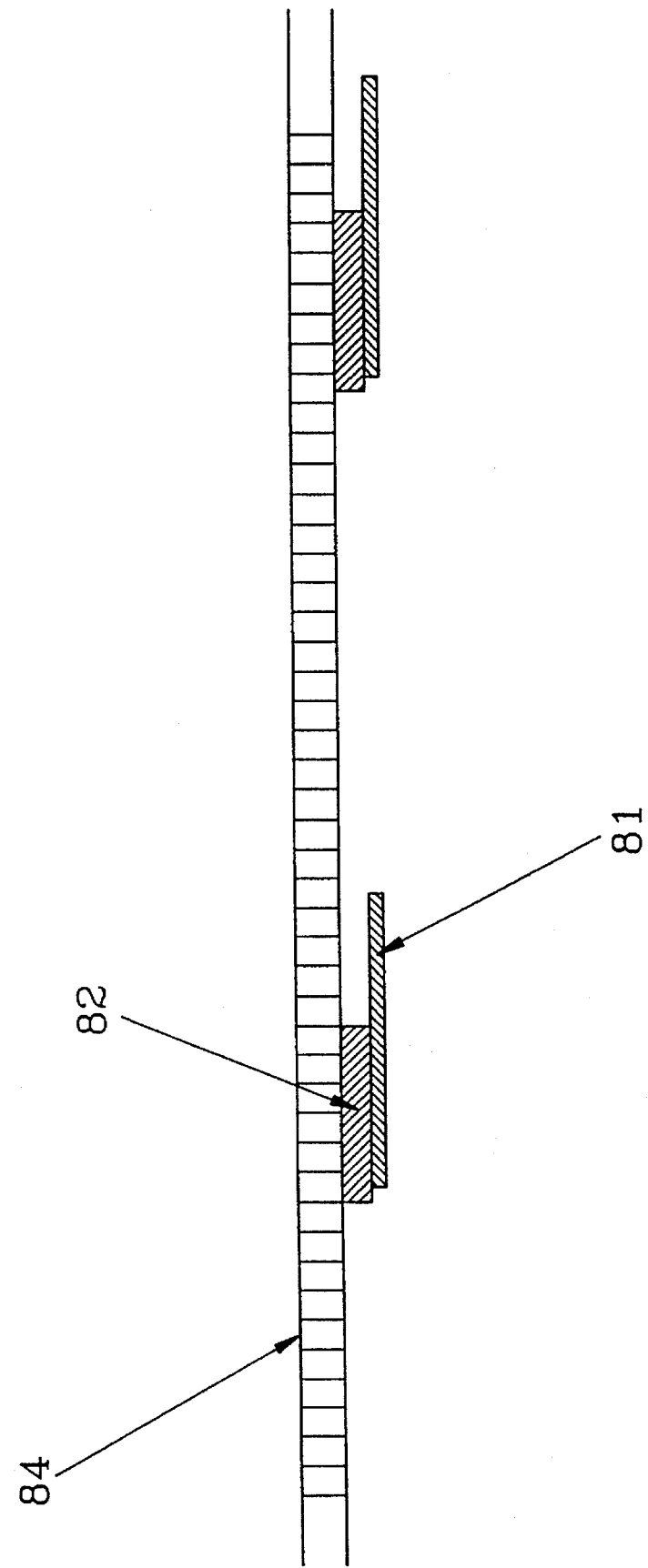

EXTERNAL CAVITY LASER

The present invention is a method to arrange and adjust a laser that is stable with respect to external and internal influences, and which comprises at least three optical components consisting of a laser element, which can generate optical radiation within a wavelength band, an optical collimator that inside the laser collimates radiation emitted from the laser element, and a plane reflection grating with parallel grating grooves, arranged such that the latter together with a flat reflection surface, which can be one end surface of the laser element, forms a resonator, that selects the radiation wavelength emitted by the laser.

BACKGROUND OF THE INVENTION

Small, simple and stable lasers with a long term of life, that are spectrally pure and have a well defined optical frequency, are lacking today. Solid state lasers, e.g. In the shape of semiconductor elements that are equipped with an external cavity, would fulfill the requirements if they can be made small and stable. Such a laser can from a practical point of view be termed a fixed frequency laser.

A simple stable laser, with essentially corresponding practical properties as the fixed frequency laser, but having a wavelength that stays fixed in the environment of usage is also a desired object. Such a laser, which adapts its frequency in a fashion that the radiation wavelength remains constant, even when the atmospheric environment or some other surrounding gaseous environment varies, e.g. with respect to pressure and temperature, may be termed a fixed wavelength laser.

It may be of practical interest to let the term fixed laser comprise the two variants, the fixed frequency laser and the fixed wavelength laser. The prefix fixed implies that the frequency or wavelength from a practical point of view remains constant with respect to unintentional influences from the inner and outer environment, e.g. change in temperature, mechanical shock or change in humidity. The prefix has on the other hand no bearing on the possibility of controlling the frequency. Intentional alternation or modulation of the frequency is presupposed in various embodiments of the fixed laser, e.g. through geometrical alternation of the cavity of the laser device by forces from piezoelectric elements, through change of the temperature of the laser element etc.

In many applications it may suffice that the laser has a fixed frequency, but it may not be necessary that the frequency has a given value or that it can be altered. This may be the case, e g when the laser is used as an optical source for interferometric measurements in a stable outer environment, or when the requirements on measurement accuracy are moderate. Typical applications are measurements of geometrical dimensions or recordings of the change in position of an object, e.g. In manufacturing industry.

Another class of applications in which it may suffice that the fixed laser has a fixed frequency, that does not need to be altered, comprises usages of the laser as a local oscillator in measurements of the variations of the optical frequency of a laser light source.

Shall the laser on the other hand be used for accurate interferemetric measurements in an outer environment with varying air parameters then it As necessary to keep the air wavelength of the laser radiation constant, which implies that the frequency shall be adjusted along with the variations in the air parameters.

In many intended applications of the fixed laser it is necessary to be able to control its frequency. In spectroscopic applications of the fixed laser, e.g. In analysis of gases, one must be able to adjust its frequency to coincide with the frequency of an absorption line. Alteratively one must be able to sweep the frequency across a region that includes the absorption line.

Another field in which one must be able to control or modulate the frequency of the fixed laser, e g through changing the external cavity by piezoelectric or similar forces, is optical communication and other applications which Amply transmission of information.

To sum up, the fixed laser can be expected to find many applications as an optical source of radiation in applications concerned with measurements, analysis, sensing and information technology.

A realization of the fixed laser requires new solutions to a number of technical problems.

In conventional mechanical manufacturing and alignment of optical components in a laser device only a limited precision can be achieved. In terms of position and angular attitude this may typically be 10 μm and 1 milliradian respectively. By using more costly manufacturing methods the precision can be increased somewhat. The tolerances mentioned are not sufficient to keep the external cavity adjusted for lasing, i.e. In a state that it can emit laser radiation. To achieve this, adjustments are required to an accuracy of a tenth or s few tenths of a μm in position and a tenth or few tenths of a milliradian in angle.

THE OBJECT OF THE INVENTION AND ITS MOST IMPORTANT CHARACTERISTICS

A first object of the invention An question is to achieve a fixed laser with small dimensions and a long term of life, that is spectrally pure end has a well defined optical frequency and a minimal dependence on changes in the inner end outer environment, e.g. on alterations in temperature and pressure.

A second object of the invention in question is to achieve a fixed laser of a simple construction, that is easy to assemble, and that only requires a minimal effort to adjust, and that is possible to fix in the adjusted position such that it retains its frequency.

A third object is to achieve a fixed laser in which the frequency can be controlled or modulated, e.g. by a geometrical alteration of the external cavity.

A fourth object is to achieve a fixed laser An which the wavelength of the radiation remains constant in a varying outer air or gas environment.

The above objects of the invention are attained through the means specified in the accompanying patent claims.

A basic observation in the invention is that there are two directions essential to the procedure of lining up a laser device that has a grating resonator, the direction L O of the collimated radiation and the direction G of the grating grooves. When these two directions become perpendicular, the laser device has been lined up end radiation having a wavelength, which is determined by the grating equation.

$$N_S \times \lambda/2 = d \times \sin \alpha, \quad (1)$$

is returned from the grating in a direction opposite to that of the incident radiation. In (1) λ is the radiation wavelength, $N_o$ the grating order, d the distance between consecutive grating grooves and α the angle of incidence of the radiation with respect to the grating. The returning radiation is focussed by the lens device, that has collimated the radiation, to the point or spot of the laser element from which the radiation has been emitted. Thus if the angle Φ between the two directions mentioned above is 90° the device has been aligned for lasing. There however, still another prerequisite for lasing to occur.

The laser element must be able to emit radiation at the wavelength $\lambda_o$, which satisfies the grating equation (1). The exact value $\alpha_o$ of a has not been predetermined, but deviates in the fabrication of the device, and in procedure of adjusting Φ, somewhat from an assumed or nominal value. The laser element must thus be able to emit radiation within a wavelength range which contains $\lambda_o$.

In using a semiconductor laser element, which is one type of laser elements intended for the fixed laser, it is not difficult to fulfill the requirement that $\lambda_o$ shall fall within the radiation range of the laser element. A semiconductor laser element, nominally radiating at $\lambda \times 1.55$ μm, can typically be used for generating laser radiation within a range 1.50–1.60 μm. According to the grating equation, using $No=1\lambda_o=1.55$ μm and $\alpha_o=45°$, the range $\lambda_1-\lambda_2=1.55\pm0.05$ corresponds to an angular range $\alpha_1-\alpha_2=45°\pm2°$. The angle a can thus be easily preset such that $\lambda$ falls in the wavelength range for potential lasing.

The direction of the collimated radiation is defined by the line LO in FIG. 1, that runs between the aperture of the laser element, which in case of a semiconductor element is the end surface of a radiation channel about 1 μm wide, and the optical center O of the lens. The tilt of the lens with respect to the line in question is not very critical. This corresponds to the fact that one gets a good point image in the focal plane with parallel near axial rays.

The requirement discussed earlier to have an accuracy of a tenth or a few tenths of a μm in the adjustment of the position of an optical component refers to a plane that contains the direction of collimation LO and the direction G of the grating grooves and concerns changes in the direction G. The corresponding requirement on the accuracy in the angular adjustment refers to the angle in the plane just mentioned.

The adjustment in the direction of collimation, e.g. of the distance between the lens and the laser element, has to be made with an accuracy, that is perhaps ten times lower than the accuracy required for changes in the direction G. A possible way is to separately manufacture and adjust a unit consisting of a lens and a laser element. A small trimming of the cavity length with up to $\lambda/4$, that may be needed to avoid that the laser oscillates in an unstable position between two modes, can best be done with the laser running through a change of the refractive index of the laser element, e.g. via the electric current through the element or via the temperature of the element.

A background assumption to the invention is that it should be possible to manufacture and assemble the structural components of the fixed laser, holders for optical components and the like, using conventional workshop precision. A basic idea in the invention is that after the assembly of the fixed laser, the final adjustment of it to optimal lasing, at a not entirely predetermined wavelength $\lambda_o$ within the band $\lambda_1-\lambda_2$, can be made by rotation of one of the optical components of the laser, which is then fixed.

FIG. 2 and 3 show examples of possible final rotational adjustments. If for instance the laser element 1 is rotated about a fixed axis K that is approximately perpendicular to the direction G of the grooves, then the line LO, that is the line between the aperture L of the laser element and the optical center O of the lens, oscillates and describes a cone that has its tip in O. If instead the lens is rotated in a similar fashion, then the line LO at some angle of rotation becomes perpendicular to the grating grooves, that is Φ=90°. The choice of cone angle determines how large a portion of a complete revolution one has to turn in order to be sure to reach the state Φ=90°.

The rotation of one component, e.g. the laser element, can for instance be done by having it placed eccentrically in a cylindrical tube whose axis becomes the axis of rotation K. If the lens is symmetrically placed in the tube that turns the laser element, then the conical pendulous movement of LO becomes the same as with the long spatially fixed.

When it is the laser element that is turned one has reason to choose the conical angle sufficiently large that the element does not got a change in attitude, that would be troublesome with respect to the polarization of the radiation. The corresponding problem arises if one instead turns the grating. It does not, however, occur when it is the lens that is turned.

DESCRIPTION OF THE DRAWINGS

The invention wall be further described below with reference to the attached drawings, which show examples of embodiments of the invention.

a) Front view of the attachment b) section A—A perpendicular to the plane in a)

Figure 14A:
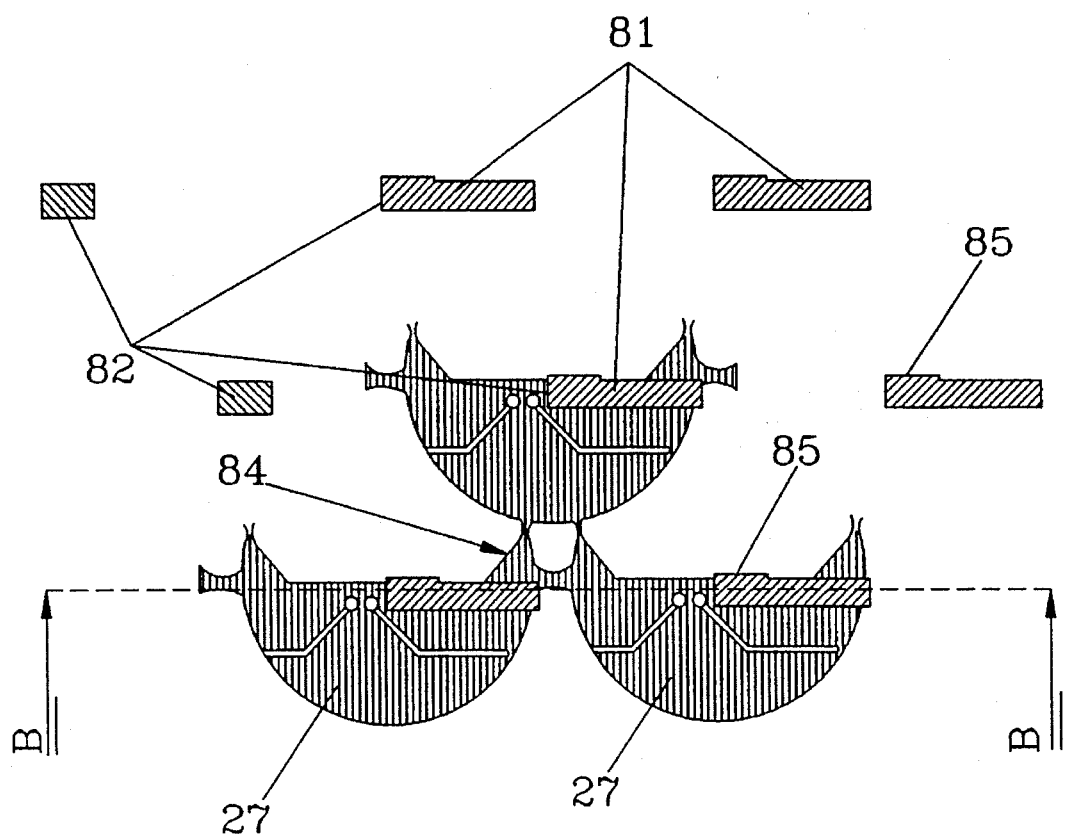

FIGS. 14(a & b) Joining of base plate, insulator block and soldering tongue at simultaneous manufacture of many laser attachments;

a) Part of continous sheet of base plates and details from soldering tongue sheet and block assembly b) Section B—B perpendicular the front view in a)

DESCRIPTION OF EMBODIMENTS

Figure 4:
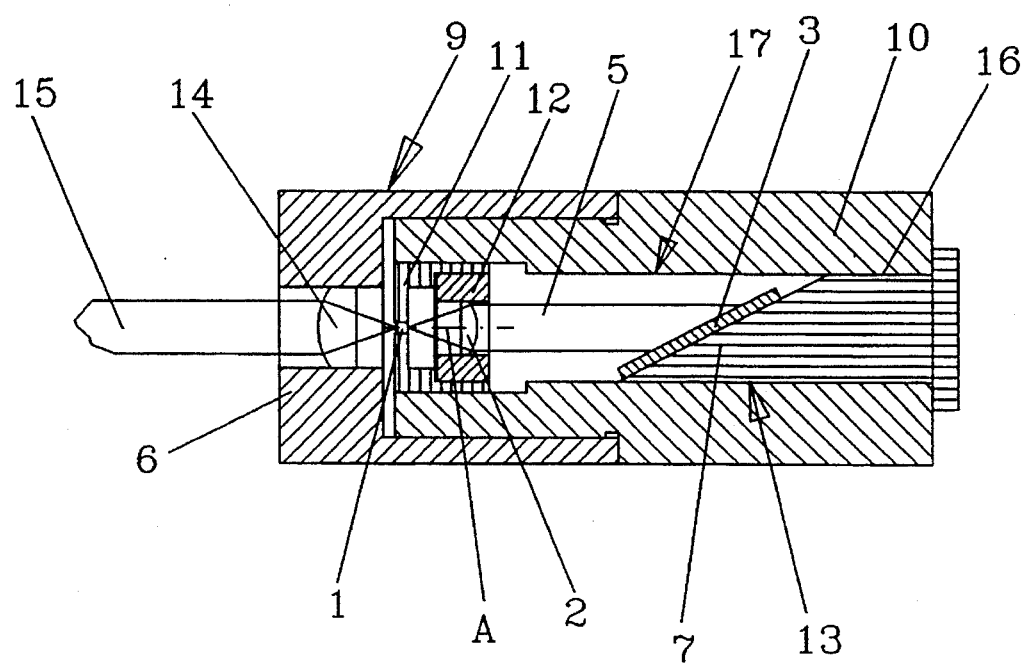
FIG. 4 shows a central section along the main axis A in a first embodiment of a fixed laser according to the present invention

The fixed laser has in a first embodiment see FIG. 4, a main body 10, that is rotationally symmetric, and has a central axial lining-up bore 17 with a main axis A. A grating seat 13, which has a tap 7 with a cylindrical fit, that may be very high, ±0.5 µm, is inserted into the lining-up bore. The lens 2 is fixed in the tube 12, which in turn is inserted into the tube 11. The optimal position of 12 relative to 11 is tested separately, for instance in an adjustment fixture and it is checked that the radiation 5 is collimated at s predetermined nominal wavelength. After that 11 and 12 are fixed relative to each other, for instance by welding.

The laser element 1 and the collimator lens 14, used for collimating the beam 15 leaving the laser, are mounted on the tubes 11 and 6 respectively, which are fitted to two turned holds on the main body 10. The components are thus put together according to a telescopic principle, with the axes of all tubes coinciding with the main axis A. A deviation from the rotational geometry is that the grating 3 is mounted on en obliquely chamfered tap of the seat 7, and means on the tube 11 for fixing the laser element 1. In order to adjust the position of the laser element the tube 11 can be turned about the main axis A until the radiation from the fixed laser shows, that the angle Φ has been turned to 90°. After that the tube 11 is fixed to the main body 10.

In the example given of a first embodiment of the fixed laser, the laser element 1 is eccentrically placed on the tube 11 such that its deviation from the symmetry axis A is 10–50 µm. During the mounting of the element 1 its position is checked in a microscope or through inserting into the tube 11 a gauge with cylindrical fit and which has position markings. A central symmetrical positioning of lens 2 in the tube 12 can easily be done with sufficient precision without the use of special measuring gauges.

The example of a first embodiment of the fixed laser can be varied as to a number of design details. The carrier tubes for the optical components can thus be mounted on the main body 10 in other ways than has been shown in the example. The tubes 11 and 12 can for instance be inserted into, or slipped on to the main body in other ways, than has been exemplified. It is for example also possible to let one or several of the component carrying tubes have another axis of rotation K than the main axis A.

Figure 6:
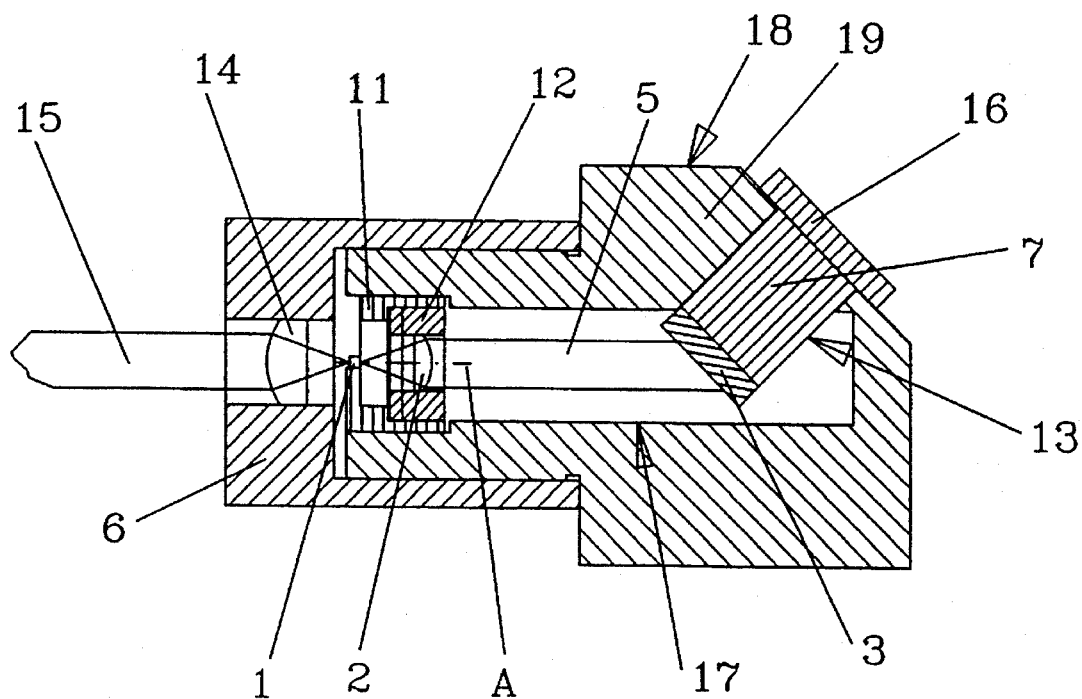
FIG. 6 shows a central section along the main axis A in a second embodiment of a fixed laser according to the present invention

FIG. 6 shows an example in variation of mounting. It is a second embodiment of the grating mounting in a fixed laser, in which the rotational symmetry of the main body 10 about the main axis A has been abandoned. The advantage of this arrangement is that the grating is mounted perpendicularly to the cylindrical tap 7 of the seat, which is inserted in an oblique bore in the main body 18, in such a way that the normal to the grating surface will form a predetermined angle α to the collimated radiation in the laser. Also the fixing of the adjusted optical components can be made in a number of other ways than by welding, e g by soldering or cementing.

Figure 8:
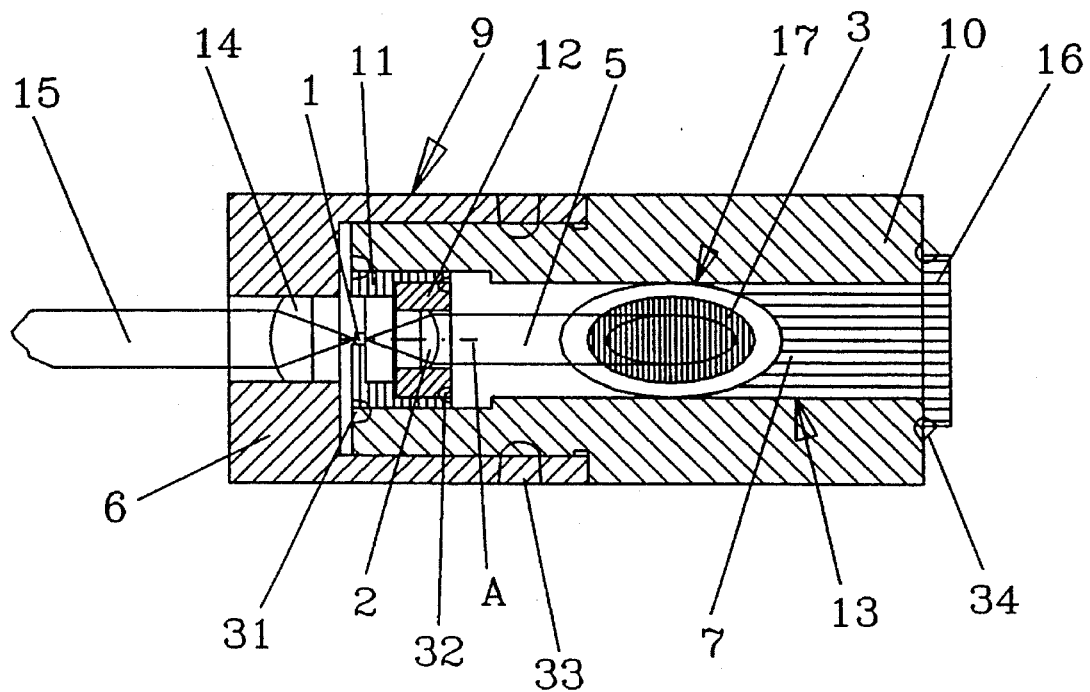
FIG. 8 shows welding seams in a fixed laser according to the first embodiment of the present invention

As evident from the above the fixed laser according to the present inventions is based on a rotational symmetry in most of the components. It can be given an extremely compact structure, which the laser device having dimensions of about 10×20 mm. It is easy to mount, FIG. 8, and to line up. The rotationally symmetric details are potentially cheap to produce. They else give the advantage that shortcomings due to thermal expansions crosswise are avoided.

Figure 9:
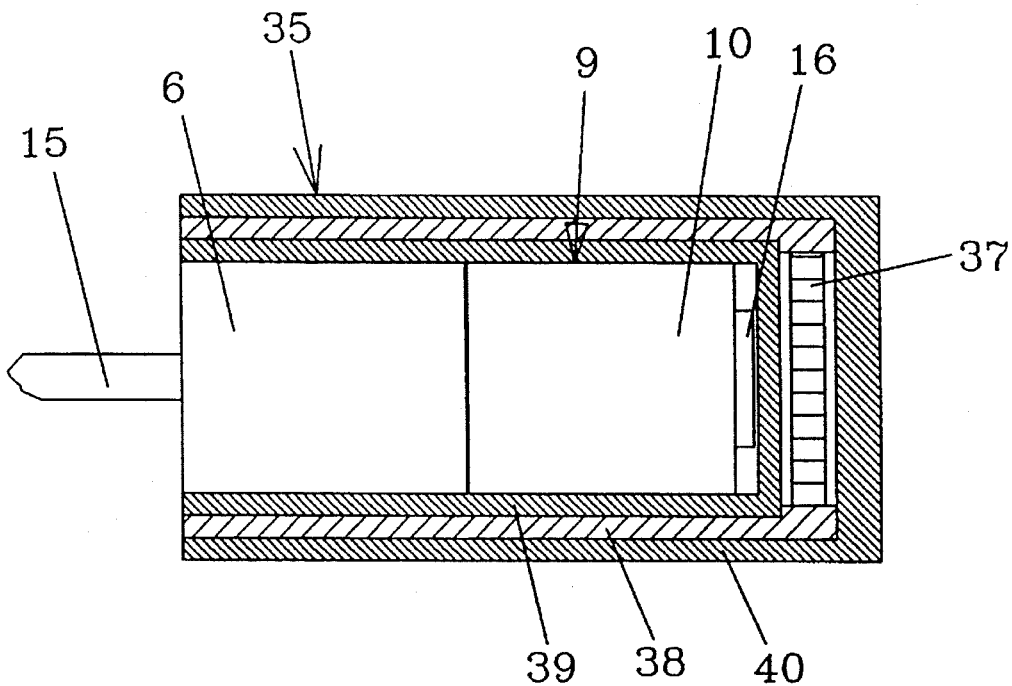
FIG. 9 shows a fixed laser according to the present invention provided with active temperature control and thermal insulation

FIG. 9 shows one embodiment of thermal stabilization of the laser device. A thermally insulating material 38, e.g. silicone rubber, polyurethane or polystyrene is applied between a cooling flange 40 and an inner tube 39, which serves to equalize the temperature. In addition the material acts as a vibration suppressor with respect to acoustic interference. In this embodiment a thermoelectric element 37, e.g. a peltier element, is located in the space formed in between the bottom ends of the outer cooling flange 40 and the inner temperature equalization 39.

By a suitable choice of construction materials the device can be passively stabilized the requirement, in order to have the radiation frequency as stable as possible with respect to temperature influences, is that the change in optical length of the resonator of the laser device, that is in the combined optical length of laser element.and external cavity, is minimized.

Figure 1:
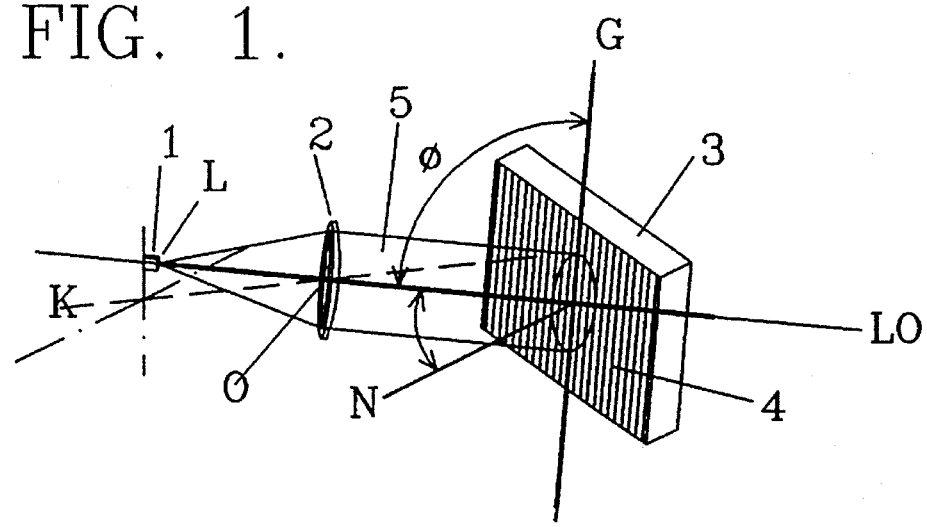
FIG. 1 shows schematically the positions of the optical components of the laser according to the present invention.
Figure 2:
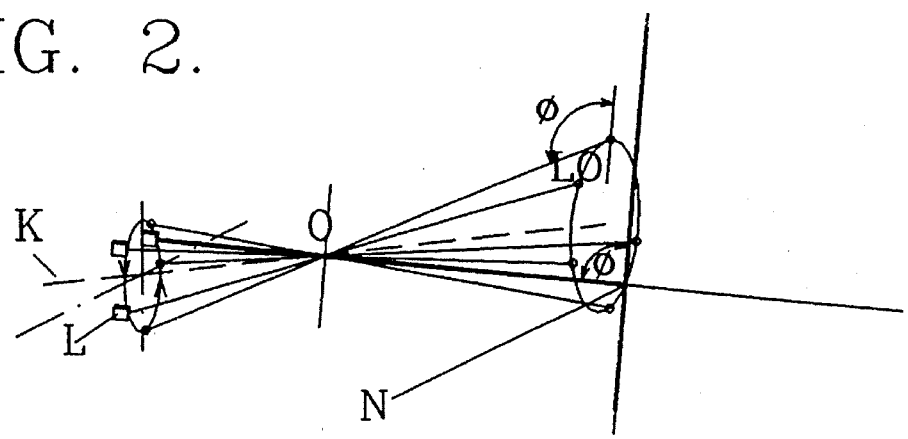
FIG. 2 shows turning of the laser element in order to alter the direction of collimation LO O in the laser according to the present invention
Figure 3:
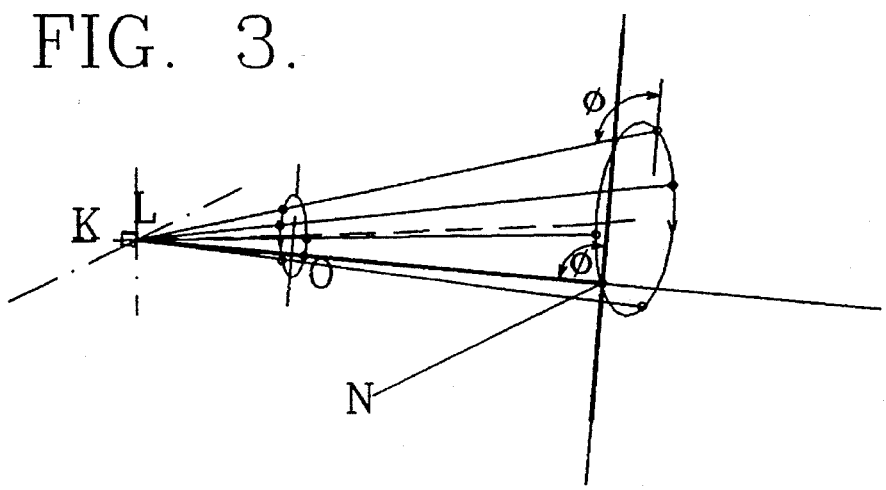
FIG. 3 shows turning of the lens on order to alter the direction of collimation LO in the laser according to the present invention

The rotationally symmetric construction of the fixed laser in FIG. 1 implies that the Joining together can be carried out in such a way that the inside of the laser becomes hermetically sealed off from the outer atmosphere. In this way the fixed laser frequency is not influenced by alternations in air pressure and humidity. The hermetic sealing also implies that the laser element is protected from influences by the environment, that can degrade the radiation properties of the element. It is also possible to replace the ordinary air in the laser cavity by an inert gas.

The embodiments shown shall only be considered as examples of possible variations of the fixed laser.
Passive thermal It is unavoidable that the optical resonator length $1_o$ changes with variations in temperature. Contributions among others come from:

A) Thermal expansion/contraction of the laser element 1, the collimator lens 2 and the mechanical arrangements 7, 10, 11 and 12, which keep the optical parts in their places.

B) Changes in the refractive indices of the optical components of the cavity with temperature, dn/dT.

Changes (1/n) dn/dT An the laser element 1 can for instance be of the order of $5 \times 10^{-6}$ K$^{-1}$ and in the lens 2 of the order of $10^{-6}$ K$^{-1}$.

All these contributions will add with their respective magnitudes and signs. The ambitions should therefore be to get as small as possible a "vector sum" in adding the contributions.

There are in the resonator with the geometrical length 1 a number of optical elements in former optical components and air, which may be numbered with a running index i.

l=geometrical resonator length=$\Sigma a_i$ $a_i$=the length of an element $a_i$=its expansion coefficient $n_i$=its refractive index The optical length of the resonator is $$l_o = \Sigma a_i n_i = 1 n_{air} + \Sigma a_i (n_i - n_{air})$$

where $\Sigma$ implies a summation over all elements i. The variation of the optical resonator lens $l_o$ with temperature is $$DER\ l_o = DER(1n_{air}) + \Sigma a_i \alpha_i (n_i - n_{air}) + \Sigma a_i DER(n_i - n_{air}) \quad (3)$$

Where DER means the derivative with respect to the temperature T.

In order to get as small as possible a wavelength change in the radiation when the temperature changes, the design of the resonator should be chosen such as to minimize DER $l_o$ according to (3).

A further thermal effect is that the grating changes its spatial groove frequency with temperature. It is therefore advantageous to choose a substrate material with as small a thermal expansion coefficient as possible. Another alternative would be to mount the grating in such a way. that it turns with a temperature change and thereby satisfies the grating equation (1) for a constant wavelength output.

Alternation and control of the frequency of the fixed laser

In adjusting the fixed laser to lasing, by turning an optical component, ego the laser element 1, the lens 2 or the grating 3, in such a way that the line LO becomes perpendicular to the grating groove direction G, the wavelength at which the laser emits is not completely predictable. One can only predict that it will lie within a certain wavelength interval, that is determined by the inaccuracy in mechanical manufacturing and mounting of the laser. The laser, with a turning arrangement for adjustment of one component, becomes a fixed frequency laser with a not altogether predetermined wavelength. The laser can be used for a number of applications that have been touched upon above.

Figure 5:
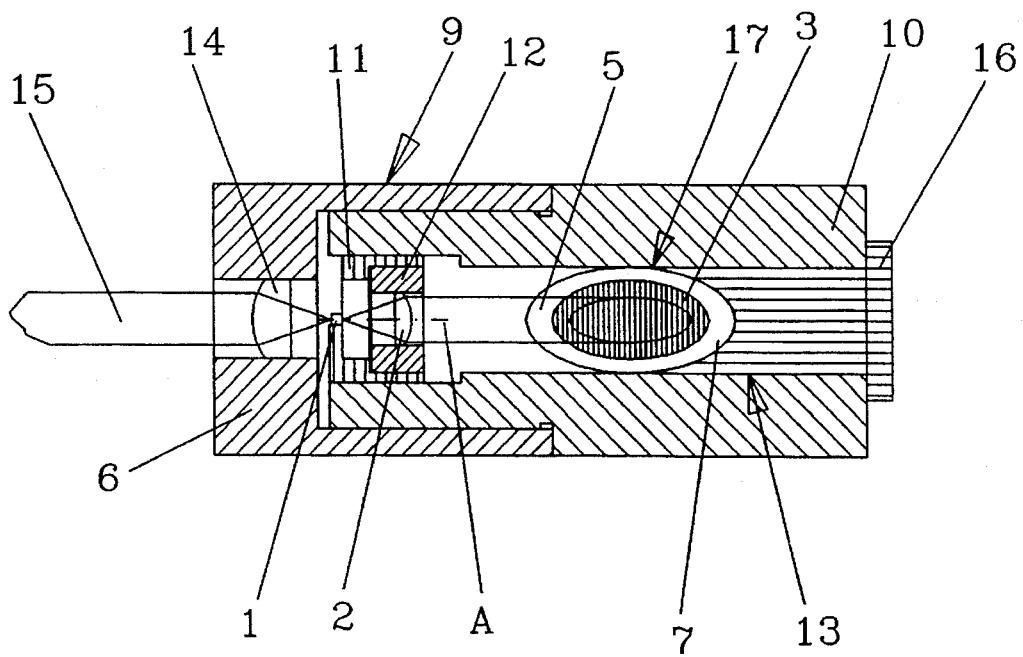
FIG. 5 shows a central section of the fixed laser in FIG. 4 with its plane perpendicular to that of the section of FIG. 4

If one wants to be able to adjust the laser to a given frequency, a second adjustment arrangement has to be introduced. With such an arrangement that turns one of the optical components about a fixed axis, one can change the angle $\alpha$ between the normal N to the grating surface and the direction LO of the Collimated radiation 5 in FIG. 5, maintaining the angle $\Phi = 90°$. Such a rotation can be realized by turning the grating about a fixed axis parallel to the direction G of the grating grooves. As a consequence of the initial inaccuracy in lining up the optical elements in the device, the rotational axis of the grating and the grating grooves do not become altogether parallel, they form an angle of perhaps some milliradiant. There is a weak coupling between the adjustment of a and the maintaining of $\Phi \pm 90°$. It is estimated that one can alter a with $\pm 1°$ without changing $\Phi$ so much, a few tenths of a milliradian, as to alter the lasing capability of the laser. For a fixed laser, at the wavelength 1.55 μm, this according to the grating equation (1), corresponds to the wavelength interval 1.55 ±0.02 μm.

In the fixed laser it may be more practical to turn some other component that the grating 3. In the fixed laser 9 of FIG. 5, $\Phi$ is adjusted to 90° by turning the tube 11 with the eccentrically fixed laser element 1.

Figure 7:
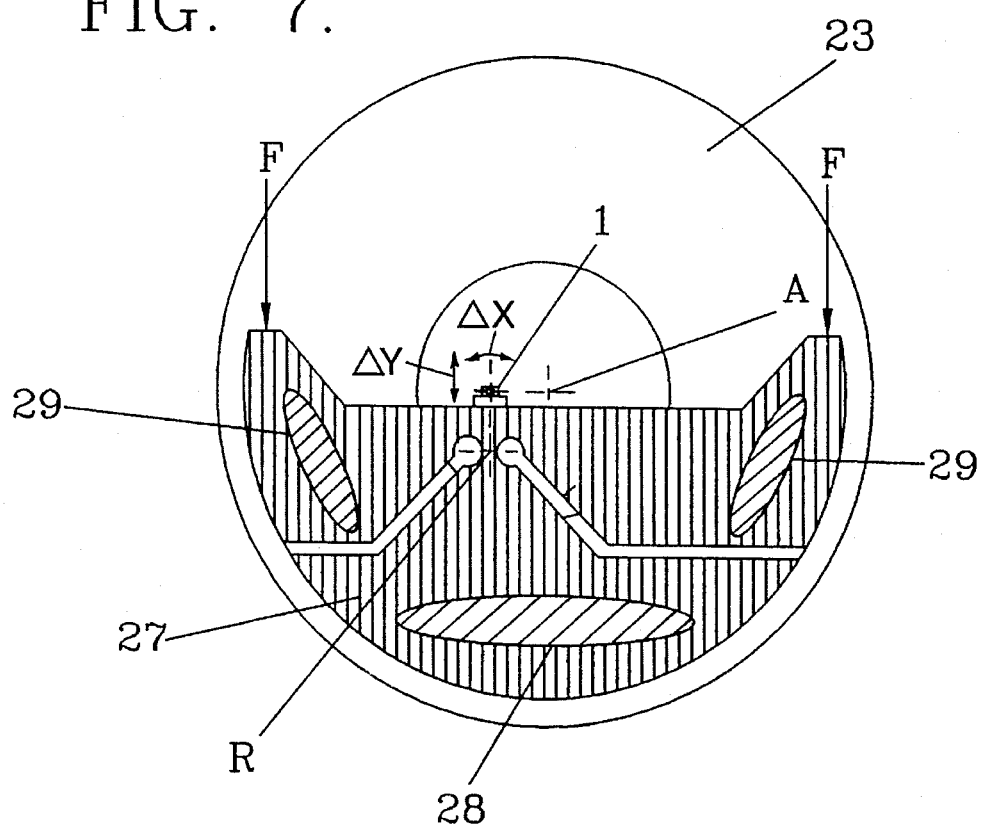
FIG. 7 shows a frontal view of an example of a laser element holder with an arrangement for adjustments in a fixed laser according to the present invention

FIG. 7 shows a base plate of a laser holder 27, fixed by a first weld to the end surface of the rotatable tube 23. By turning the tube, with the eccentrically placed laser element 1 one gets a first adjustment arrangement. A second one is obtained through the fact that the holder constitutes an elastic hinge for turning the laser element 1 about the axis R.

The rotational axis of the tube 23 is A. A small turn of the tube displaces the element 1 a distance $\Delta y$. The change $\Delta y$ corresponds to an adjustment of the angle $\Phi$. If a force F is applied in the upper portion of the hinge perpendicularly to the axis R, the laser element rotates about the axis R and the laser element is moved a distance $\Delta x$, that is almost perpendicular to $\Delta y$. The change $\Delta x$ corresponds to a change of the angle $\alpha$, that is of the wavelength or frequency of the radiation. After the final adjustment of $\Delta x$, the base plate is fixed through the welds 29.

A trim of the wavelength or frequency can be made in the fixed laser even after the components have been fixed and the laser sealed, if the position or attitude of one of the optical components can be changed by forces from piezoelectric elements or the like.

Mode hop free turning can be made if the applied forces turn the grating about an axis in the manner described in patent application SE 8902948-2.

A fast frequency modulation of the radiation can for instance be made through modulation of the length of the cavity, by the action of forces from one or several piezoelectric elements on some component, e.g. the grating.

The laser frequency in the sealed fixed laser can also be changed by controlling the inner temperature of the laser, e.g. the arrangement 37 for temperature control An FIG. 9. If the laser is operated at a temperature, that is above room temperature, then the thermoelectric arrangement 37 can be substituted simply by a resistive heater. This is a much cheaper solution.

Constant and controllable wavelength of the fixed laser

It As desirable in many cases, e.g. In interferemetric measurements, that the laser radiation maintains a constant wavelength in an outer atmosphere, i.e. that the wavelength is not influenced by changes in air pressure, temperature and humidity. The parameters mentioned influence the refractive index of the air, and thereby the wavelength of the laser radiation.

In order to maintain the wavelength constant, when the refractive index of the air varies, a change of the frequency of the fixed laser As required. The frequency can be controlled by the signal from a wavelength stable interferometer. The error signal when the wavelength deviates from its fixed value controls the frequency of the fixed laser. This feed back works to maintain the signal at its fixed value. The corresponding method can also be used when the outer environment As another gas instead of air.

Figure 10:
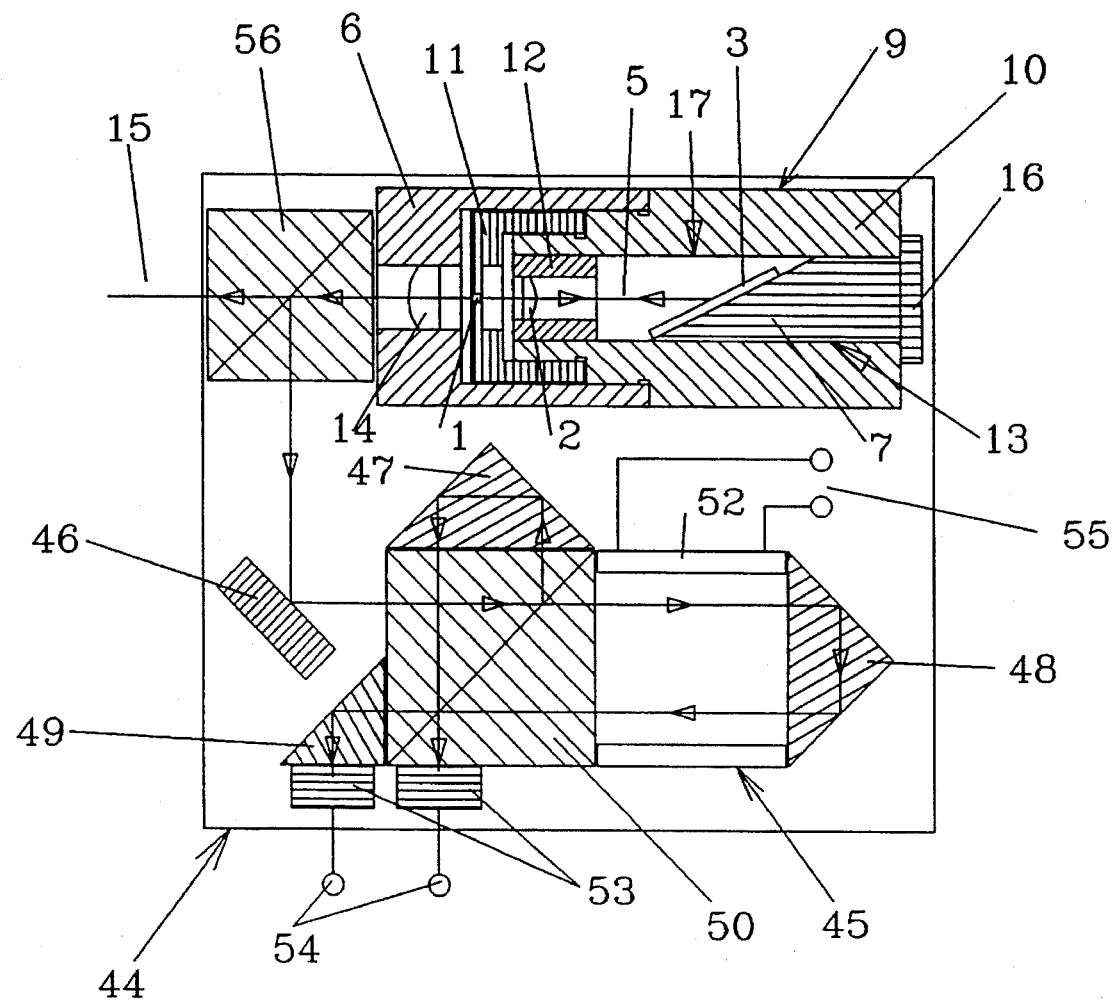
FIG. 10 shows a fixed laser arrangement for keeping the radiation wavelength constant in an outer environment according to the present invention, which is controlled by feeding back a signal from a wavelength sensing interferometer that is firmly attached to the laser and is in atmospheric contact with the outer environment.
Figure 11:
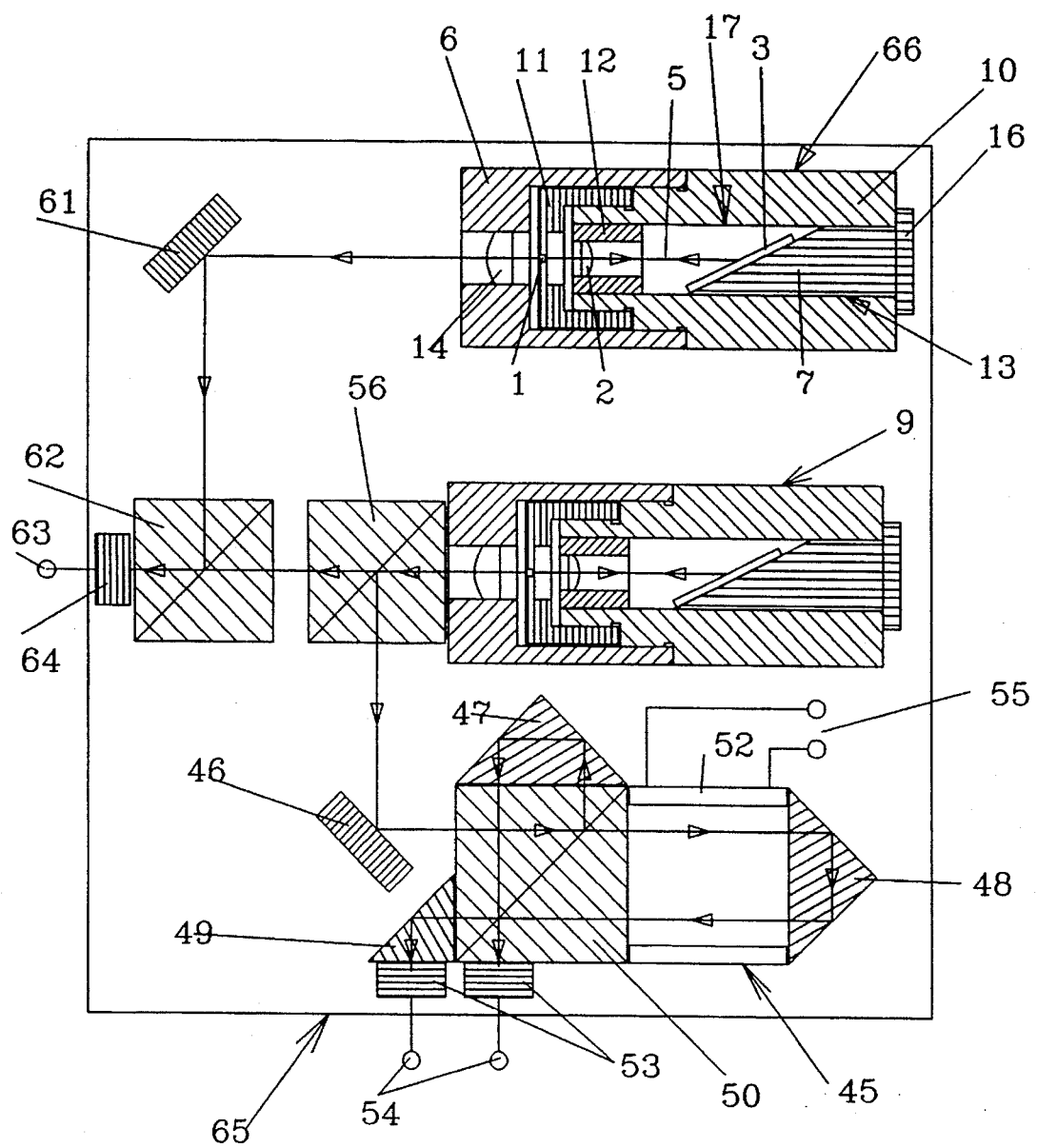
FIG. 11 shows the arrangement of FIG. 10 to which has been added a further laser, optical components which bring the emission from the two lasers together, and a photodetector of the two laser omissions as a measure of changes in the refractive index of the outer environment according to the present invention.

The interferometer 45 in FIG. 10, intended for wavelength stabilization, is fixedly Joined to the fixed laser 9. The length of one of the interferometer arms, that ends with the prism 48, can be controlled by the cylindrical piezoelement 52. Radiation from the two interferometer arms is brought together on the two detector element 53, which have the outlets 54. The position of the retroprism 48, and thereby the signals from the detector elements 53, is modulated via the piezocontrol signal applied at 55. The interferometer must be in atmospheric connection with the space in which the measurements are made, so that the atmosphere in the interferometer is representative of the measurement environment.

The relation between the radiation wavelength in air $\lambda_1$, the frequency and the refractive index $n_1$, is $$\lambda_1 = c/(n_1 v) \quad (5)$$

where the constant c is the speed of light. In order that the wavelength $\lambda_1$ remains fixed, the frequency of the fixed laser 9 in FIG. 12 must be changed in such a way that $$n_1 v = const. \quad (6)$$

The change in refractive index of the air or of a gas can thus be recorded by the change in frequency. The frequency change can be measured by Joining the laser radiation 15 from the arrangement in FIG. 10 with the radiation from a second fixed laser with detector, that is sufficiently fast to record the frequency difference. The second,laser in this case serves as an optical local oscillator.

Mounting of grating on seat

The seat 13 onto which the optical grating is to be applied, can be made of e.g. quartz, ceramics, or metal. The taps can be manufactured with great precision.

In the two fixed lasers embodiments FIG. 4 and FIG. 6 respectively the tap of the seat which supports the grating can be obliquely or perpendicularly cut and ground. In the oblique case the end surface of the tap typically can form an angle in the magnitude of 45° with the axis of the tap. In order to produce seats with gratings to low price many gratings have to be applied at the same time to the seats.

Figure 12A:
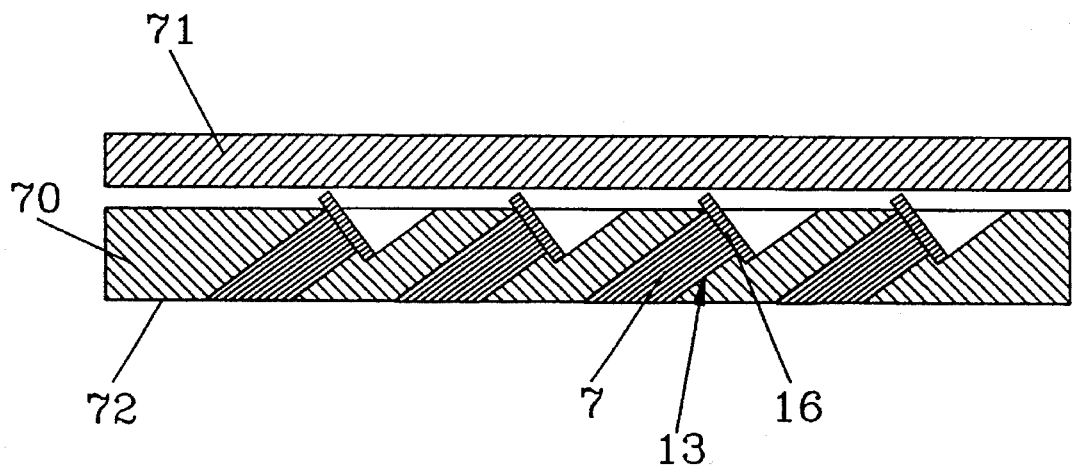
FIGS. 12(*a* & *b*) show sections of fixture devices for common application of holographic grating on a number of seat taps. *a*) Device for holographic layer application directly on the seat taps b) Device for holographic layer on a base which is fixed to the seat taps.
Figure 12B:
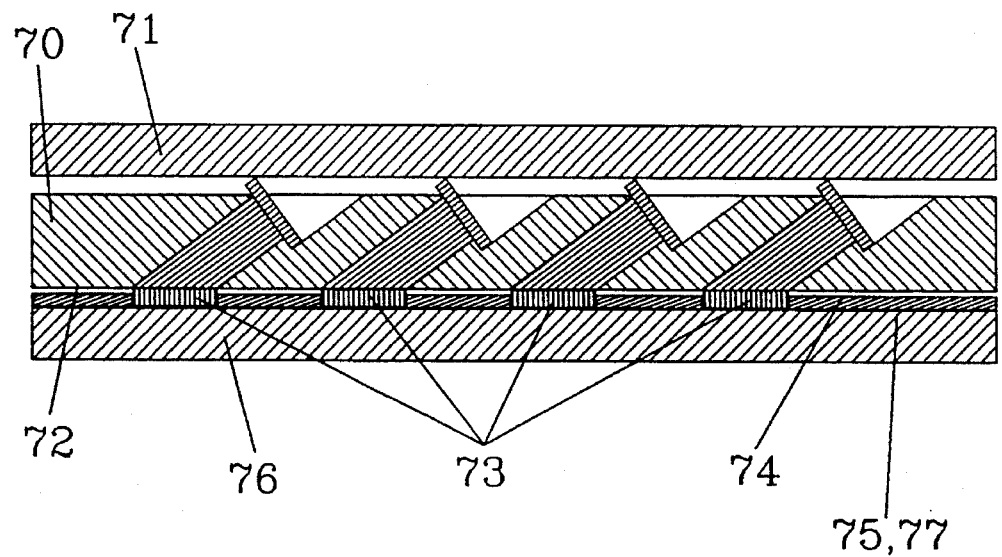

A method to carry out is the following, FIG. 12a. A greater number of grating seats, e.g. 100–400 per dm$^2$ are placed in paralell bores with good cylindric fitting in a fixture block 70 of e.g. invar. The seats are fixed, with e.g. an upper clamping device 71 and face grinded and polished common sop that the surface of the tap ends are situated in a plane 72. A holographic grating is applied by known technique over the common end plane. The seats with grating applied are cut free from the common holographic layer. The holes of the seats in the fixture block can have their axes perpendicular to the layer plane or form an angle with this depending on the oblique cutting off the taps. An alterative method, FIG. 12b, to mount grating on the seat end surfaces, by means of a similar fixture block 70 as above, is to first apply plane ground bases 73, of e.g. quartz, on the plane ground ends of the taps 7 of the grating seats. The bases can also alternatively be of piezo electric material which gives possibility to control the length of the external cavity or to control the distance between the grooves of the grating.

The substrates are placed in a lateral fixture 74, the thickness of which is somewhat less than the height of the base. Joining means is applied between the bases and the taps of the seats and fixation is carried out by heating in oven or drying. During the fixation the bases are pressed against the taps of the seats by a lower clamping device 76 with a plane ground upper surface 77, whereby the bases after the fixation will obtain a common end plane 75 which is defined by the surface.

Production of laser,mounting

Figure 13A:
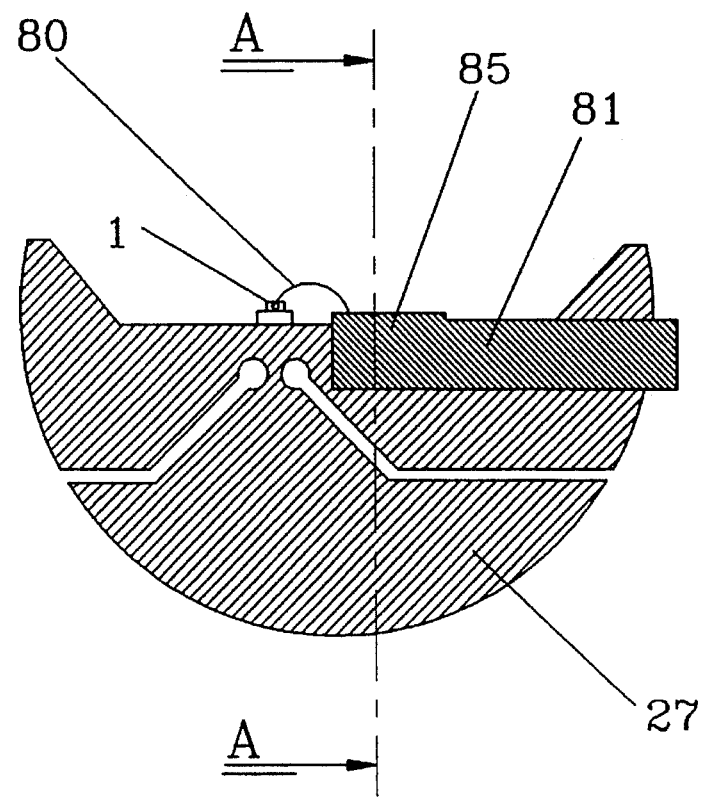
FIGS. 13(a & b) shows a laser attachment of hinge type with soldering tongue.
Figure 13B:
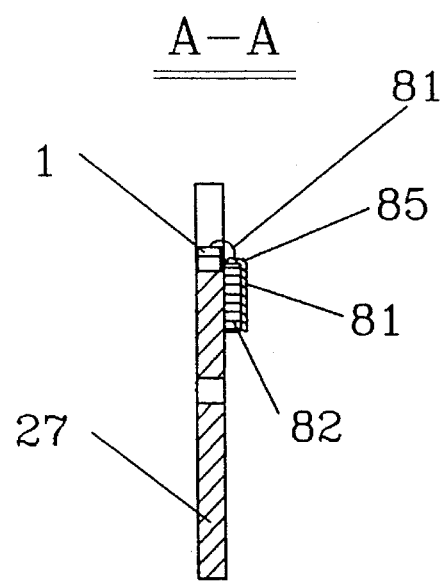

The laser mounting in FIG. 13a and b is designed for simultaneous production of many mounts by a sheet technique, where the number of mounts can be of the magnitude of 100 per dm$^2$. In the production method the base plate 27 should be joined with the ceramics block 82 and the soldering tongue 81. After the joining the separate laser mountings are cut loose from each other. The laser element 1 then can be soldered to the edge of the base plate facing upwards and bonding 80 is performed between the element and the edge of the soldering tongue. The manufacture of the laser mounts certainly may vary with respect to its details but the main features are the following.

1. A sheet of connected base plates for the laser mount 27 are produced from a metal disc, e.g. 1 mm thickness by etching or similar technique.

2. Fastening means e.g. soldering tan, is applied by screen printing, at the points on the sheet of base plates 84 where the ceramic blocks are to be fixed. Alternatively mounting surfaces for the ceramic blocks can be obtained by spot dosing of glue.

3. The blocks are placed out on a supporting disc in correct pattern for the joining to the base plates by use of a lateral fixture.

4. The sheet of base plates is positioned above the disc with blocks. By heating or drying the blocks are fixed to the base plates.

5. A sheet of continous soldering tongues 81 are manufactured from a metal disc with a thickness of e.g. 0.3 mm by etching or similar technique.

6. Solder for soldering the tongues to the blocks is applied to the solder tongue sheet by screen printing. Alternatively spot dosing can be made for adhesive fixing.

7. The sheet with soldering tongues is placed above the ceramic blocks and the tongues are fixed to the blocks by heating or drying.

8. A bending and exposing tool is applied over the sheet with soldering tongues, whereby the edge 85 on these is bent over the blook edge and the tongues are released from the common sheet.

9. The continous base plates are cut loose from each other by means of an exposing tool, whereafter the separate mountings are ready for mounting of laser elements and bonding between the element and the bent solder tongue edge.

LIST OF REFERENCE SYMBOLS USED IN THE DRAWINGS OF THE FIGURES

L=that portion on the surface of the laser element that emits radiation
O=optical center of the lens 2
LO=line through L and 0
N=line normal to the plane of grooves of the grating 3
G=line in the direction of the grating grooves 4
Φ=angle between LO and G
α=angle between LO and N
K=axis of rotation for an optical component
A=main axis of the lining up bore in 10 or 19
F=pressure force
R=hinge axis for turning of 1
X=movement of 1 in the x-direction when turning about R
Y=movement of 1 in the y-direction when turning about A
1=laser element
2=collimator lens for the inner radiation 5
3=reflection grating
4=grating groove
5=collimated radiation inside the fixed laser
6=tube holder for collimator lens 14
7=tap on grating seat or seat tap
9=fixed laser
10=rotationally symmetric main body with lining up bore and turned recesses for attachment of components
11=tube with holder for 1
12=tube holder for 2
13=grating seat
14=collimator lens for the outer radiation 15
15=collimated radiation leaving the laser
16=head of grating seat
17=lining up bore
18=fixed laser
19=body with lining up bore and turned holds for the components
23=tube for holding the laser element
27=base plate of laser holder shaped as an elastic hinge
28=first laser weld
29=laser weld for fixing after turning about R
31=welding seam
32=welding seam
33=welding seam
34=welding seam 35=fixed laser with temperature control and thermal insulation
37=thermoelectric element
38=thermal insulation e g silicone rubber, polyurethane or polystyrene
39=inner tube for levelling of temperature
40=outer cooling flange
44=fixed laser with interferometer
45=interferometer
46=mirror
47=retroprism in a first interferometer arm
48=retroprism in a second interferometer arm
49=reflection prism
50=beam split cube
52=piezoelectric cylinder
53=photodetector
54=detector output
55=input for voltage to piezoelectric element
56=beam split cube
61=mirror
62=beam split cube
63=detector output
64=detector
65=fixed laser arrangement for measuring of change of refractive index in an outer environment
66=fixed laser used as a local oscillator
70=fixture block
71=upper clamp yoke
72=end surface
73=plant ground base
74=lateral fixture
75=end surface
76=lower clamp yoke
77=upper plane surface
80=bonding wire
81=solder tongue
82=insulating ceramic block
84=part of base plate sheet
85=edge on soldering tongue

We claim:

1. A method to arrange and adjust a laser device having a single adjustment parameter to set the device in a lasing condition to emit at a wavelength $\lambda_0$, where the deviation between a predefined wavelength and the sole wavelength ($\lambda_0$), at which the device is capable of lasing, is dependent on the mechanical precision with which the device can be manufactured and lined up, which laser device comprises optical components including a laser element (1), which can generate optical radiation within a wavelength band ($\lambda_1-\lambda_2$) containing $\lambda_0$, an optical collimator (2) inside the laser which collimates radiation emitted from the laser element, and a plane reflection grating (3) with parallel grating grooves, arranged such that the latter together with a flat reflection surface, which can be one end surface of the laser element, forms an optical resonator, which selects the radiation wavelength emitted by the laser device, characterized in, mounting said optical components in an hermetically sealed environment, at least one of the said optical components (1, 2, 3) being mounted in a holder (11, 12, 13), for movement of the one component relative to each of the other optical components, which holder can be turned about an axis (K) to adjust the laser to a lasing condition, the holder being mounted such that the axis (K) defines an angle $\Phi$ between two directions, defined by the direction along the grating grooves (G) and by the direction of collimation (LO) of the radiation, that when turning the holder varies within an interval that contains $\Phi=90°$.

2. A method according to claim 1, characterized therein, that thereon said one of the optical components is turned about a fixed axis having a direction such that in turning the optical component(s) the angle $\Phi$ between the direction along grating grooves (G) and the direction of collimation (LO) remains substantially at $\Phi=90°$ and the angle of incidence ($\alpha$) to the plane of the grating grooves is altered, changing the radiation wavelength within the band ($\lambda_1=\lambda_2$), which can be maintained in the said optical resonator of the device.

3. A method according to claims 1 or 2, wherein said one of the optical components (1, 2, 3) is turned about said fixed axis in response to changes in the ambient atmosphere in such a way that the direction of collimation (LO) remains at a right angle to the grating grooves (G) and, the angle of incidence ($\alpha$) to the plane of the grating grooves is controllable and the wavelength of the radiation variable.

4. A laser device comprising a main body (10; 19) having a central bore (17) extending therethrough;

which laser device comprises optical components including a laser element (1), which can generate optical radiation within a wavelength band ($\lambda_1-\lambda_2$), an optical collimator (2) within said laser device for collimating radiation emitted from the laser element, a planar reflection grating (3) with parallel grating grooves, and reflector means defining a flat reflection surface, which reflector means can be one end surface of the laser element, said reflector means and said reflection grating forming an optical resonator, characterized in, that the laser device further includes a first tube (12) within which is mounted said optical collimator (2), a second tube (11), which holds the laser element (1), the first tube (12) being rotatably mounted in the second tube (11) which is rotatably mounted in the central bore (17) of the main body (10; 19), the reflection grating (3) being arranged on a grating seat (13) which is rotatably mounted in a bore of the main body (10; 19), the main body being rotatably fitted within a third tube (6) formed with an end wall having an opening arranged with a transparent optical component (14).

5. A laser device according to claim 4, characterized therein, that the reflection grating is mounted on an obliquely chamfered face provided on a cylindrical tap (7) of the grating seat (13) and that the tap is mounted in the central bore (17).

6. A laser device according to claim 4, characterized therein, that the reflection grating is mounted on a face provided on the cylindrical tap (7) of the grating seat (13) and that the tap (7) is mounted in a second bore in the main body (19), the axis of said tap being in a direction that is different from that of the axis (A) of said central bore.

7. A laser device according to claim 4, characterized therein, in that the device includes a Peltier element to keep the temperature constant in the laser device through supply or removal of heat.

8. A laser device according to claim 4, characterized therein, that the laser device is hermetically sealed, such that the refractive index in the inner environment is not influenced by changes in pressure, humidity and/or gas composition in the environment exterior thereto.

9. A laser device comprising a main body (10; 19) having a central bore (17) extending therethrough;

which laser device comprises optical components including laser element (1), which can generate optical radiation within a wavelength band ($\lambda_1$–$\lambda_2$), an optical collimator (2) within said laser device for collimating radiation emitted from the laser element, a planar reflection grating (3) with parallel grating grooves, and reflector means defining a flat reflection surface, which reflector means can be one end surface of the laser element, said reflector means and said grating means forming an optical resonator characterized therein, that the laser device further includes a first tube within which is mounted said optical collimator (2), a second tube (11), which holds the laser element, the first tube being rotatably mounted in the second tube, which is rotatably mounted in the central bore of the main body, the reflection grating being arranged on a grating seat (13), which is rotatably mounted in a bore of the main body, said main body being rotatably fitted within a cap-shaped third tube having an opening arranged with a transparent optical component (14), a laser carrier having a first part fixedly mounted on the second tube and a second part hingedly connected to the first part, the laser element being mounted on said second part eccentrically with respect to said central bore axis for movement from a first position to a second position (A) whereby, by the movement of said second part relative to said first part, the positioning of said laser element can be adjusted, said second part being adapted after adjustment to said second position to be fixed to said second tube.

10. A laser device according to claim 9, characterized therein that the second hinge part is welded to said second tube in the second position of said second hinge part.

11. A laser device according to claims 4 or 9, characterized therein, that the position of the planar reflector means relative to the reflection grating is variable to alter the variable radiation frequency, while maintaining an angle ($\Phi$) formed between the axis of collimation and the grating grooves at 90°.

12. A laser device according to claim 11, characterized therein, that one or more piezoelectric elements (52) are operatively arranged with said reflector means to effect change in the position thereof.

13. A laser device according to claim 9, characterized therein, in that the device includes a Peltier element to keep the temperature constant in the laser device through supply or removal of heat.

14. A laser device according to claim 9, characterized therein, that the laser device is hermetically sealed, such that the refractive index in the inner environment is not influenced by changes in pressure, humidity and/or gas composition in the environment exterior thereto.

15. A laser device according to claims 4 or 9, characterized therein, that a wavelength measuring interferometer (45) is operatively connected to said laser device and is operative to transmit a signal to control the frequency in the laser device, which measuring interferometer (45) is positioned in the ambient atmosphere surrounding the main body and is responsive to the refractive index of such atmosphere to produce a signal corresponding to such index, such that the radiation emitted from the laser element may be maintained at a substantially constant wavelength in said atmosphere as the refractive index of said atmosphere varies.

16. A laser device according to claim 15, characterized therein, that the said interferometer (45) is fixedly joined to the laser (9).

17. A laser device according to claim 16, comprising a second laser device (66), the second laser device (66) being a local oscillator with a constant frequency, and measuring means (53, 64) operatively arranged with said laser devices to measure variation in frequency differences between said laser devices to determine a change in refractive index (n) in the ambient atmosphere from the relation $v \times n$=constant.

18. A method of mounting laser gratings upon grating seats comprising the steps of providing a plurality of grating seats each comprising a cylindrical tap having an end surface, providing a rectangular fixture block having a plane face surface and a plurality of axially parallel bores extending through said block from said plane face surface, mounting said taps in said fixture block with said end surfaces of said taps each protruding a predetermined distance from said plane face surface, applying an abrasive means to said protruding end surfaces to remove sufficient material from each of said taps to cause the end surface thereof to lie in said plane, thereafter applying a sheet of holographic grating and bonding said sheet in alignment with the periphery of each of said end surfaces, and thereafter removing said grating seats from said fixture block.

19. A laser device according to claim 15, comprising a second laser device (66), the second laser device (66) being a local oscillator with a constant frequency, and measuring means (53, 64) operatively arranged with said laser devices to measure variation in frequency differences between said laser devices to determine a change in refractive index (n) in the ambient atmosphere from the relation $v \times n$=constant.

* * * * *

UNITED STATES PATENT AND TRADEMARK OFFICE
CERTIFICATE OF CORRECTION

PATENT NO.  : 5,530,714
DATED       : June 25, 1996
INVENTOR(S) : Vilhelmsson et al.

It is certified that error appears in the above-identified patent and that said Letters Patent is hereby corrected as shown below:

Column 1, line 19, "e.g. In" should read --e.g. in--.

Column 1, line 56, "e.g. In" should read --e.g. in--.

Column 1, line 64, "is As necessary" should read --is it necessary--.

Column 2, line 3, "e.g. In" should read --e.g. in--.

Column 2, line 12, "which Amply" should read --which imply--.

Column 2, line 27, "i.e. In a" should read --i.e. in a--.

Column 2, line 29, "or s few" should read --or a few--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 2, line 34, "invention An" should read --invention in--.

Column 2, line 36, "pure end has" should read --pure and has--.

Column 2, line 37, "inner end outer" should read --inner and outer--.

Column 2, line 48, "laser An which" should read --laser in which--.

Column 2, line 59, "up end" should read --up and--.

Column 2, line 61, "$N_5 x\lambda/2 = dx\sin\alpha,$" should read --$N_0 x\lambda/2 = dx\sin\alpha,$--.

Column 3, line 5, "There however" should read --There is, however--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 3, line 9, "$\alpha_0$ of a has" should read --$\alpha_0$ of $\alpha$ has--.

Column 3, line 18, "$\lambda$x1.55$\mu$m" should read --$\lambda$=1.55$\mu$m--.

Column 3, line 20, "No=1" should read --$N_0$=1--.

Column 3, line 20, "1 $\lambda_0$" should read --1, $\lambda_0$--.

Column 3, line 22, "angle a" should read --angel $\alpha$--.

Column 4, line 7, "laser clement" should read --laser element--.

Column 4, line 12, "the long spatially" should read --the lens spatially--.

Column 4, line 15, "not got a" should read --not get a--.

Column 4, line 23, "wall" should read --will--.

Column 5, line 25, "at s" should read --at a--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 5, line 35, "on en obliquely" should read --on an obliquely--.

Column 6, line 5, "As evident" should read --As is evident--.

Column 6, line 8, "structure, which" should read --structure, with--.

Column 6, line 11, "They else give" should read --They also give--.

Column 6, line 24, "stabilized the" should read --stabilized. The--.

Column 6, line 32, "Joining" should read --joining--.

Column 6, line 35, "alternations" should read --alterations--.

Column 6, line 43, "thermal" should read --thermal stability--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 6, line 44, "$1_0$" should read --$\ell_0$--.

Column 6, line 53, "(1/n) dn/dT An" should read --(1/n) dn/dT in--.

Column 6, line 54, "$5 \times 10_{-6}$ $K_{-1}$" should read --$5 \times 10_{-5}$ $K_{-1}$--.

Column 6, line 60, "length 1" should read --length $\ell$--.

Column 6, line 61, "former" should read --form of--.

Column 6, line 66, "$a_i$=its" should read --$\alpha_i$=its--.

Column 7, line 2, "$\ell_0 = \Sigma a_i n_i = 1 n_{air})$" should read --$\ell_0 = \Sigma a_i n_i = \ell n_{air}$--.

Column 7, line 19, "way. that" should read --way, that--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 7, line 22, "Alternation and control of the frequency of the fixed laser" should read --<u>Alteration and control of the frequency of the fixed laser</u> and should be spaced from line 21 to show as a title--.

Column 7, line 24, "ego" should read --e.g.--.

Column 7, line 40, "Collimated" should read --collimated--.

Column 7, line 47, "milliradiant" should read --milliradians--.

Column 7, line 48, "of a and" should read --of $\alpha$ and--.

Column 7, line 48, "$\phi \pm 90°$" should read --$\phi = 90°$--.

Column 7, line 49, "alter a" should read --alter $\alpha$--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 7, line 55, "that the" should read --than the--.

Column 8, line 21, "control An" should read --control in--.

Column 8, line 26, "Constant and controllable wavelength of the fixed laser" should read --<u>Constant and controllable wavelength of the fixed laser</u> and should be spaced from line 25 to show as a title--.

Column 8, line 27, "It As" should read --It is--.

Column 8, line 27, "e.g. In" should read --e.g. in--.

Column 8, line 27, "interferemetric" should read --interferometric--.

Column 8, line 36, "As required" should read --is required--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 8, line 42, "As another" should read --is another--.

Column 8, line 44, "Joined" should read --joined--.

Column 9, line 1, "Joining" should read --joining--.

Column 9, line 4, "second, laser" should read --second laser--.

Column 9, line 6, "on seat" should read --on a grating seat--.

Column 9, line 18, "paralell" should read --parallel--.

Column 9, line 20, "sop that" should read --so that--.

Column 9, line 27, "off" should read --of--.

UNITED STATES PATENT AND TRADEMARK OFFICE
CERTIFICATE OF CORRECTION

PATENT NO. : 5,530,714
DATED : June 25, 1996
INVENTOR(S) : Vilhelmsson et al.

It is certified that error appears in the above-identified patent and that said Letters Patent is hereby corrected as shown below:

Column 9, line 27, "alterative" should read --alternative--.

Column 9, line 44, "laser, mounting" should read --laser mounting--.

Column 9, line 60, "soldering tan" should read --soldering tin--.

Column 10, line 15, "blook" should read --block--.

Column 10, line 29, "L and 0" should read --L and O--.

Signed and Sealed this

Twentieth Day of January, 1998

BRUCE LEHMAN

Attest:

Attesting Officer

Commissioner of Patents and Trademarks